United States Patent
Kidera et al.

(10) Patent No.: US 12,100,563 B2
(45) Date of Patent: Sep. 24, 2024

(54) ARC DETECTION SYSTEM, ARC DETECTION METHOD, AND RECORDING MEDIUM

(71) Applicant: Panasonic Intellectual Property Management Co., Ltd., Osaka (JP)

(72) Inventors: Kazunori Kidera, Osaka (JP); Tatsuo Koga, Osaka (JP); Takahiro Ohori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 136 days.

(21) Appl. No.: 18/015,134

(22) PCT Filed: Sep. 8, 2021

(86) PCT No.: PCT/JP2021/032957
§ 371 (c)(1),
(2) Date: Jan. 9, 2023

(87) PCT Pub. No.: WO2022/065031
PCT Pub. Date: Mar. 31, 2022

(65) Prior Publication Data
US 2023/0253167 A1    Aug. 10, 2023

(30) Foreign Application Priority Data

Sep. 25, 2020   (JP) ................................. 2020-161115

(51) Int. Cl.
*H01H 1/00* (2006.01)
*H02H 3/093* (2006.01)

(52) U.S. Cl.
CPC .......... *H01H 1/0015* (2013.01); *H02H 3/093* (2013.01)

(58) Field of Classification Search
CPC ............................. H01H 1/0015; H02H 3/093
See application file for complete search history.

(56) References Cited

U.S. PATENT DOCUMENTS 6,639,769 B2 * 10/2003 Neiger ................... H02H 1/043
361/42
2007/0252603 A1   11/2007 Restrepo et al.
(Continued)

FOREIGN PATENT DOCUMENTS

JP    2005-293317 A    10/2005
JP    2005-294077 A    10/2005
(Continued)

OTHER PUBLICATIONS

International Search Report for corresponding Application No. PCT/JP2021/032957, mailed Nov. 30, 2021.
(Continued)

*Primary Examiner* — Paresh Patel
(74) *Attorney, Agent, or Firm* — Renner, Otto, Boisselle & Sklar, LLP

(57) ABSTRACT

An arc detection system includes an obtainer and a determiner. The obtainer obtains a measurement result for current flowing in a power supply line to which power is supplied from a DC power source. The determiner determines, based on a component of a specific frequency band in the measurement result for the current obtained by the obtainer, whether an arc fault has occurred. The determiner determines that the arc fault has occurred when a specific time for which the component of the specific frequency band is at least a threshold is longer than an occurrence time in which an arc can occur when a device is attached to or detached from the power supply line.

8 Claims, 5 Drawing Sheets

(56) References Cited

U.S. PATENT DOCUMENTS

| | | | |
|---|---|---|---|
| 2010/0033888 A1* | 2/2010 | Dougherty | G01R 31/54 |
| | | | 702/58 |
| 2011/0141644 A1* | 6/2011 | Hastings | H01L 31/02021 |
| | | | 361/93.2 |
| 2011/0249370 A1* | 10/2011 | Nayak | H02H 1/0015 |
| | | | 361/42 |
| 2013/0335861 A1* | 12/2013 | Laschinski | H02H 1/0015 |
| | | | 361/2 |
| 2016/0111870 A1 | 4/2016 | Murano et al. | |
| 2017/0343596 A1 | 11/2017 | Misumi | |
| 2018/0115144 A1* | 4/2018 | Murnane | H02S 50/00 |
| 2023/0341475 A1* | 10/2023 | Takahashi | G01R 31/58 |
| 2023/0358794 A1* | 11/2023 | Kim | G01R 23/02 |
| 2023/0384398 A1* | 11/2023 | Takahashi | G01R 31/58 |
| 2023/0393218 A1* | 12/2023 | Takahashi | H02H 1/0015 |

FOREIGN PATENT DOCUMENTS

| | | |
|---|---|---|
| JP | 2011-7765 A | 1/2011 |
| JP | 2011-34687 A | 2/2011 |
| JP | 2014-220888 A | 11/2014 |
| JP | 2016-166773 A | 9/2016 |

OTHER PUBLICATIONS

Written Opinion for corresponding Application No. PCT/JP2021/032957, mailed Nov. 30, 2021.

European Search Report for corresponding European Patent Application No. 21872162.9 dated Mar. 15, 2024.

* cited by examiner

ARC DETECTION SYSTEM, ARC DETECTION METHOD, AND RECORDING MEDIUM

TECHNICAL FIELD

The present invention relates to an arc detection system, an arc detection method, and a recording medium that determine whether there is a possibility of an arc fault occurring in a power supply line.

BACKGROUND ART

PTL 1 discloses an arc detection means for detecting an arc. This arc detection means includes a voltage detection means that measures a voltage value between input-side wiring to a terminal block and output-side wiring from the terminal block, and a current detection means that measures a current value in the output-side wiring from the terminal block. The arc detection means discriminates between electrical noise and the like and arcs at the terminal block by simultaneously detecting fluctuations in the voltage value in the voltage detection means and fluctuations in the current value in the current detection means.

CITATION LIST

Patent Literature

[PTL 1] Japanese Unexamined Patent Application Publication No. 2011-7765

SUMMARY OF INVENTION

Technical Problem

The present invention provides an arc detection system, an arc detection method, and a recording medium that easily prevent erroneous detections of the occurrence of an arc fault.

Solution to Problem

An arc detection system according to one aspect of the present invention includes an obtainer and a determiner. The obtainer obtains a measurement result for current flowing in a power supply line to which power is supplied from a DC power source. The determiner determines, based on a component of a specific frequency band in the measurement result for the current obtained by the obtainer, whether an arc fault has occurred. The determiner determines that the arc fault has occurred when a specific time for which the component of the specific frequency band is at least a threshold is longer than an occurrence time in which an arc can occur when a device is attached to or detached from the power supply line.

An arc detection method according to one aspect of the present invention includes a step of obtaining and a step of determining. In the obtaining, a measurement result is obtained for current flowing in a power supply line to which power is supplied from a DC power source. In the determining, it is determined, based on a component of a specific frequency band in the measurement result for the current obtained in the obtaining, whether an arc fault has occurred. The determining includes determining that the arc fault has occurred when a specific time for which the component of the specific frequency band is at least a threshold is longer than an occurrence time in which an arc can occur when a device is attached to or detached from the power supply line.

A recording medium according to one aspect of the present invention is a non-transitory computer-readable recording medium having recorded thereon a program that causes at least one processor to execute the above-described arc detection method.

Advantageous Effects of Invention

An advantage of one aspect of the present invention is that erroneous detections of the occurrence of an arc fault are easily prevented.

DESCRIPTION OF EMBODIMENTS

Figure 1:
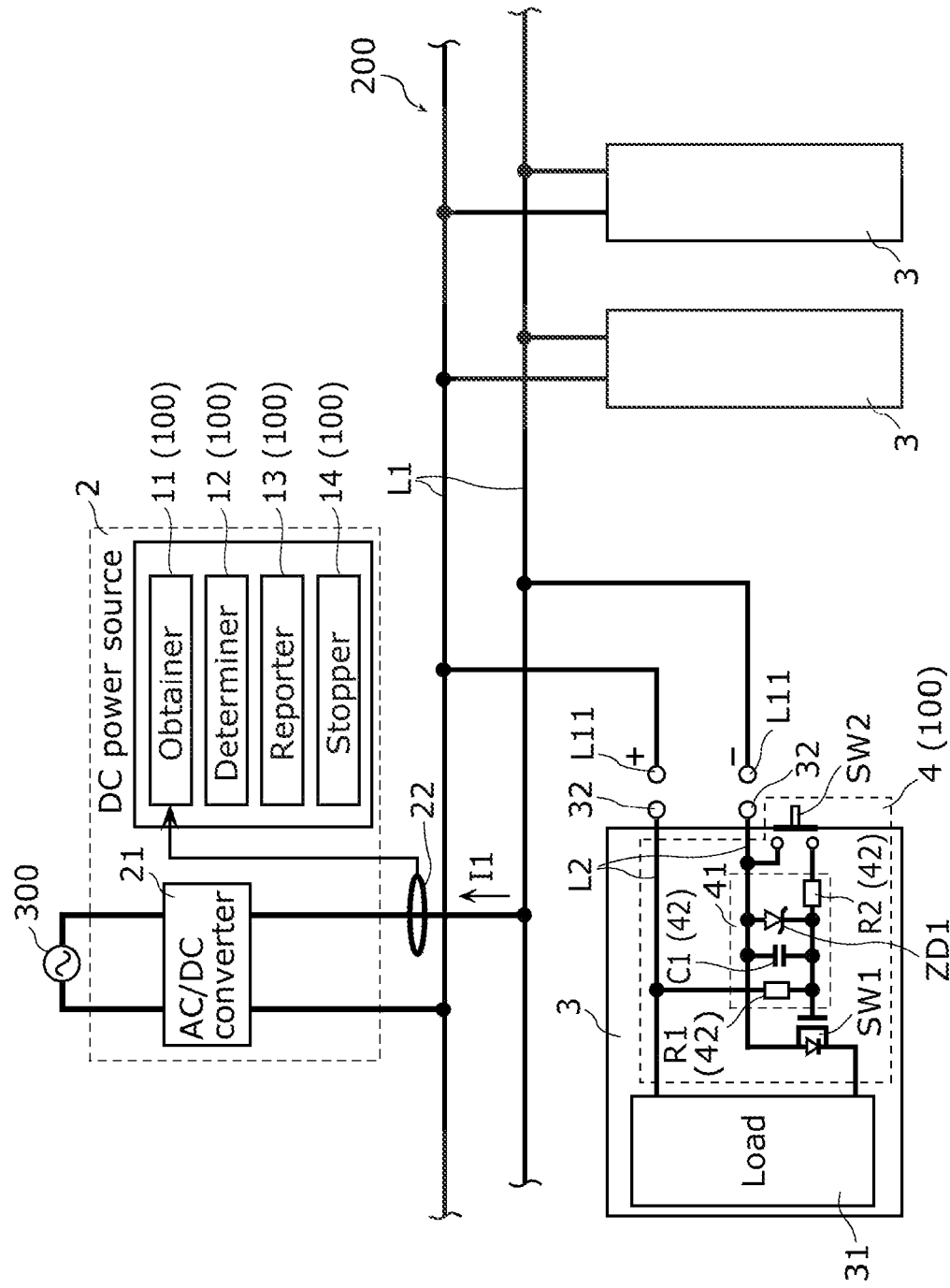
FIG. 1 is a schematic diagram illustrating the overall configuration of an arc detection system according to Embodiment 1.

Embodiments of the present invention will be described hereinafter with reference to the drawings. The following embodiments describe specific examples of the present invention. As such, the numerical values, shapes, materials, constituent elements, arrangements and connection states of constituent elements, steps, orders of steps, and the like in the following embodiments are merely examples, and are not intended to limit the present invention.

Note also that the drawings are schematic diagrams, and are not necessarily exact illustrations. Also, configurations that are substantially the same are given the same reference signs in the drawings, and redundant descriptions will be omitted or simplified.

Embodiment 1

[Configuration]

An arc detection system according to Embodiment 1 will be described with reference to FIG. 1. FIG. 1 is a schematic diagram illustrating the overall configuration of arc detection system 100 according to Embodiment 1.

Arc detection system 100 is a system primarily for determining whether an arc fault is occurring in power supply line L1 to which power is supplied from DC power source 2. In other words, power supply lines L1 may be damaged or broken by external factors, deterioration due to age, or the like, for example, and an arc (arc discharge) may occur due to such damage or the like, resulting in an arc fault. Accordingly, arc detection system 100 is primarily used to detect arc faults which can occur in power supply lines L1.

Specifically, arc detection system 100 is used in what is known as direct current (DC) distribution network 200. DC distribution network 200 is configured including at least one power supply line L1. Only one power supply line L1 is illustrated in FIG. 1. DC power from DC power source 2 is supplied to DC distribution network 200. Each power supply line L1 is constituted by a pair of power lines, namely a positive power supply line connected to a positive pole on an output side of DC power source 2 and a negative power supply line connected to a negative pole on the output side of DC power source 2.

Here, if DC distribution network 200 includes only one power supply line L1, the DC power from DC power source 2 is supplied to that power supply line L1. If DC distribution network 200 includes a plurality of power supply lines L1, one end of each of the plurality of power supply lines L1 is connected to at least one branch point. As such, when DC power from DC power source 2 is supplied to any of power supply lines L1, the DC power is supplied to other power supply lines L1 via the at least one branch point.

In Embodiment 1, DC power source 2 is a power conversion device including AC/DC converter 21. DC power source 2 converts AC power output from power system 300 into DC power, and outputs the resulting DC power to power supply line L1 to which DC power source 2 is connected. If DC distribution network 200 includes a plurality of power supply lines L1, the DC power supplied to the stated power supply line L1 is also supplied to the other power supply lines L1. Note that in Embodiment 1, DC power source 2 may be in any form that outputs DC power, and may be a distributed power source such as a photovoltaic cell, a power source such as a storage battery, or a combination of these power sources and a power conversion device (e.g., a power conversion device having a DC/DC converter circuit).

Each power supply line L1 is constituted by a duct rail, for example, and at least one device 3 can be attached thereto. In other words, at least one device 3 can be disposed at any position in each power supply line L1. Of course, each power supply line L1 may be in a form in which the positions to which the at least one device 3 can be attached are set in advance. In Embodiment 1, each power supply line L1 is installed in a ceiling of a facility, but may instead be installed in a floor, a wall, a fixture, or the like in a facility.

Device 3 includes load 31 and a pair of connection terminals 32. Device 3 can be attached to power supply line L1 by the pair of connection terminals 32 and detached from power supply line L1. Specifically, when attaching device 3 to power supply line L1, the pair of connection terminals 32 of device 3 are inserted into the duct rail (power supply line L1), after which device 3 is rotated a predetermined angle (e.g., 90 degrees) in the clockwise or counterclockwise direction as seen from the direction of insertion of device 3. As a result, the pair of connection terminals 32 are secured in contact with a pair of connection conductors L11 provided in power supply line L1, which electrically and mechanically connects device 3 to power supply line L1.

When detaching device 3 from power supply line L1, device 3 is rotated the predetermined angle in the direction opposite from that stated above, as seen from the direction of insertion of device 3. As a result, the state of contact between the pair of connection terminals 32 and the pair of connection conductors L11 is canceled, and device 3 can then be detached from power supply line L1. When device 3 is attached to power supply line L1, load 31 is driven by the DC power supplied from DC power source 2 through power supply line L1.

In Embodiment 1, device 3 is a lighting fixture, but may instead be a speaker, a camera, a sensor, USB power delivery (USB PD), or the like, for example. In other words, device 3 may be a device aside from a lighting fixture as long as load 31 receives and is driven by power, Additionally, although all devices 3 connected to power supply lines L1 are lighting fixtures and are one type in Embodiment 1, devices 3 connected to power supply lines L1 may be of a plurality of types. For example, a lighting fixture, a speaker, a camera, a sensor, and a USB PD may be connected to power supply lines L1. These devices 3 may all be connected to a single power supply line L1, or may be distributed among a plurality of power supply lines L1.

As functional constituent elements for determining whether an arc fault is occurring, arc detection system 100 includes obtainer 11, determiner 12, reporter 13, stopper 14, and suppression circuit 4. In Embodiment 1, obtainer 11, determiner 12, reporter 13, and stopper 14 are provided in DC power source 2, and suppression circuit 4 is provided in each device 3. In DC power source 2, arc detection system 100 is a microcomputer or a device including a microcomputer, for example. A microcomputer is a semiconductor integrated circuit or the like including ROM and RAM storing programs, a processor (central processing unit; CPU) that executes the programs, a timer, an A/D converter, a D/A converter, and the like. Obtainer 11, determiner 12, reporter 13, and stopper 14 are all implemented by the processor executing the programs.

Obtainer 11 obtains a measurement result for current I1 flowing in power supply line L1 to which power is supplied from DC power source 2. In Embodiment 1, obtainer 11 obtains the measurement result for current I1 measured by ammeter 22 sampling at a predetermined cycle (a sampling cycle). In other words, obtainer 11 obtains the measurement result for current I1 from ammeter 22 at the predetermined cycle. Ammeter 22 is provided between DC power source 2 and power supply line L1, and measures current flowing in the negative power supply line of power supply line L1 (i.e., current I1 flowing in power supply line L1). Note that ammeter 22 may be built into DC power source 2.

Determiner 12 determines, based on a component of a specific frequency band in the measurement result for current I1 obtained by obtainer 11, whether an arc fault is occurring. Specifically, determiner 12 performs a frequency analysis on the measurement result for current I1 obtained by obtainer 11. "Frequency analysis" refers to, for example, calculating the frequency spectrum of the measurement result for current I1 by performing a Fourier transform (here, a Fast Fourier Transform (FFT)) on the time waveform of the measurement result for current I1. Determiner 12 then determines whether an arc fault is occurring by referring to the calculated frequency spectrum. The specific frequency band is, for example, a band that includes the frequency of noise produced when an arc fault has occurred. As one example, the specific frequency band is a band in the tens of kHz, which is a relatively high-frequency band. Note that the frequency of the noise produced in cases such as those mentioned above can be obtained experimentally.

Here, determiner 12 compares a specific time for which the component of the specific frequency band is at least a threshold with a threshold time set in advance (e.g., 1 second), and determines that an arc fault has occurred when the specific time is longer than the threshold time. The threshold time is set in advance based on an occurrence time in which an arc can occur when device 3 is attached to or detached from power supply line L1. In other words, determiner 12 determines that the arc fault has occurred when the specific time for which the component of the specific frequency band is at least the threshold is longer than the occurrence time in which an arc can occur when device 3 is attached to or detached from power supply line L1. The following will describe the background on how the occurrence of arc faults is determined in this manner.

Two types of arcs can occur in DC distribution network 200, namely arcs caused by power supply line L1 being disconnected or semi-disconnected, and arcs that can arise momentarily when device 3 is attached to or detached from power supply line L1. In other words, if, when device 3 is attached to power supply line L1, device 3 is not attached smoothly, what is known as "chattering" can occur, in which load 31 of device 3 is repeatedly connected to and disconnected from power supply line L1 in a short period of time. During the period when chattering occurs, arcs can arise when load 31 is momentarily disconnected from power supply line L1 in a state where current is flowing. Chattering can occur in a similar manner when device 3 is detached from power supply line L1. During the period when chattering occurs, arcs can arise when load 31 is momentarily disconnected from power supply line L1 in a state where current is flowing. The occurrence of arcs caused by chattering in this manner can happen not only in DC distribution network 200, but also in an AC distribution network. However, in AC distribution networks, the current flowing in the power supply line is AC current, and thus there are moments where the current drops to zero, which tends to shorten the duration of arcs caused by chattering. Specifically, the duration of arcs is less than half the cycle of the AC current. On the other hand, with DC distribution network 200, the current flowing in power supply line L1 is DC current, and thus the current does not drop to zero, which tends to lengthen the duration of arcs caused by chattering. In particular, if device 3 is attached to power supply line L1 in a state where the distance between the electrode of device 3 and the electrode of power supply line L1 is not optimal, it is difficult to extinguish arcs.

Here, while arcs caused by disconnects or semi-disconnects in power supply line L1 tend to cause arc faults, arcs caused by chattering are basically eliminated in a short period of time and are therefore less likely to cause arc faults. Accordingly, in arc detection system 100, it is desirable to determine mainly the occurrence of arcs caused by disconnects or semi-disconnects in power supply line L1 as the occurrence of arc faults, without detecting short-duration arcs caused by chattering.

Accordingly, in Embodiment 1, suppression circuit 4 is provided in each device 3 to satisfy the foregoing requirement. As will be described in detail later, suppression circuit 4 is configured such that when device 3 is attached to power supply line L1, load 31 is connected to power supply line L1 having been delayed by a delay time. Through this, load 31 is connected to power supply line L1 after device 3 is assumed to have been securely attached to power supply line L1. This makes it unlikely that a situation such as that described above, where load 31 is momentarily disconnected from power supply line L1 in a state where current is flowing, will arise, which in turn makes it difficult for arcs caused by chattering to occur.

Additionally, as will be described in detail later, suppression circuit 4 is configured such that when device 3 is detached from power supply line L1, device 3 and power supply line L1 are electrically disconnected before device 3 is detached from power supply line L1. Through this, load 3 is disconnected from power supply line L1 after device 3 is assumed to have been detached from power supply line L1. This makes it unlikely that a situation such as that described above, where load 31 is momentarily disconnected from power supply line L1 in a state where current is flowing, will arise, which in turn makes it difficult for arcs caused by chattering to occur.

Then, when the specific time in which the component of the specific frequency band is at least the threshold is longer than the stated delay time (the threshold time), determiner 12 does not determine that the arc is caused by chattering, but rather determines that an arc caused by a disconnect or a semi-disconnect in power supply line L1 has occurred, i.e., that an arc fault is occurring. In other words, in Embodiment 1, the specific time is longer than the delay time. Here, if suppression circuit 4 is not provided, it is conceivable that arcs caused by chattering can arise during a period corresponding to the delay time. As such, the specific time being longer than the delay time corresponds to the specific time being longer than a time in which arcs can occur when device 3 is attached to or detached from power supply line L1.

Note that if suppression circuit 4 is not provided in each device 3, arcs caused by chattering can occur when device 3 is attached to or detached from power supply line L1. However, arcs caused by chattering are basically eliminated in a short period of time, and thus even if an arc caused by chattering occurs, determiner 12 does not determine that an arc fault has occurred. However, there are exceptional cases where arc faults occur due to arcs caused by chattering. In such cases, the specific time will be longer than the threshold time, and thus determiner 12 can determine that an arc fault has occurred.

Reporter 13 makes a report to the surrounding area that an arc fault is occurring by, for example, lighting a lamp, sounding a buzzer, or the like. Reporter 13 may make a report that an arc fault is occurring by transmitting information to that effect to an information terminal owned by an owner, a manager, or the like of arc detection system 100. Examples of the information terminal can include a mobile terminal such as a smartphone or a tablet, a personal computer, or the like.

Stopper 14 stops the current flowing in power supply line L1 when determiner 12 determines that an arc fault is occurring. As a result, when arc discharge is produced due to an arc fault, the arc discharge is extinguished.

For example, stopper 14 stops the current flowing in power supply line L1 by controlling a switch connected to power supply line L1. The switch is, for example, a mechanical switch or a semiconductor switch. The mechanical switch is a switch such as a relay or a breaker, and the semiconductor switch is a switch such as a transistor or a diode, for example.

Note that the switch connected to power supply line L1 may be a switch connected directly to power supply line L1, or may be a switch connected indirectly to power supply line L1. For example, the switch is a switch for implementing an AC/DC conversion function in AC/DC converter 21. Even if not connected directly to power supply line L1, the switch is connected to power supply line L1 indirectly, and is therefore a switch connected to power supply line L1. For example, stopper 14 stops the current flowing in power supply line L1 by controlling the switch to stop switching operations of the switch.

Note that the switch may be configured to switch DC power source 2 on and off. In this case, stopper 14 stops the current flowing in power supply line L1 by controlling the switch and turning DC power source 2 off.

Additionally, the switch may be provided in power supply line L1, and the switch may be configured to switch power supply line L1 between open and closed. For example, stopper 14 may stop the current flowing in power supply line L1 by controlling the switch and opening power supply line L1.

Suppression circuit 4 is a circuit for suppressing arcs that can occur when device 3 is attached to or detached from power supply line L1. Suppression circuit 4 includes first switch SW1, second switch SW2, and drive circuit 41. In Embodiment 1, suppression circuit 4 is provided between load 31 of device 3 and the pair of connection terminals 32 in each device 3.

First switch SW1 opens and closes power line L2 between load 31 of device 3 and power supply line L1. Power line L2 is constituted by a power line that connects a positive electrode-side connection terminal 32 among the pair of connection terminals 32 with a positive electrode of load 31, and a power line that connects a negative electrode-side connection terminal 32 among the pair of connection terminals 32 with a negative electrode of load 31. If first switch SW1 is on, power line L2 is closed, which establishes an electrical connection between the pair of connection terminals 32 and load 31. If device 3 is attached to power supply line L1 in this state, power is supplied from power supply line L1 to load 31 (i.e., current flows). On the other hand, if first switch SW1 is off, power line L2 is open, which electrically disconnects the pair of connection terminals 32 from load 31. Even if device 3 is attached to power supply line L1 in this state, no power is supplied from power supply line L1 to load 31 (i.e., no current flows).

In Embodiment 1, first switch SW1 is an n-channel enhancement-type Metal-Oxide-Semiconductor Field-Effect Transistor (MOSFET), In other words, first switch SW1 is a field effect transistor. Note that in FIG. 1, the diode symbol between the drain and the source represents a parasitic diode of first switch SW1. The same applies to FIG. 5, described later. The drain of first switch SW1 is connected to the negative electrode of load 31, and the source of first switch SW1 is connected to the negative-side connection terminal 32 among the pair of connection terminals 32. Drive circuit 41 is connected to the gate of first switch SW1.

Drive circuit 41 drives first switch SW1 to close power line L2 after the delay time following device 3 being connected to power line L2. In Embodiment 1, drive circuit 41 includes CR filter 42, which is connected to the gate of first switch SW1 and which applies a charging voltage for capacitor C1 to the gate of first switch SW1, The delay time is determined by a time constant of CR filter 42.

Specifically, drive circuit 41 includes first resistor element R1, second resistor element R2, capacitor C1, and Zener diode ZD1. CR filter 42 is constituted by first resistor element R1, second resistor element R2, and capacitor C1. One end of first resistor element R1 is connected to the positive-side connection terminal 32 among the pair of connection terminals 32 and the positive electrode of load 31, and the other end of first resistor element R1 is connected to the gate of first switch SW1, One end of second resistor element R2 is connected to the gate of first switch SW1, and the other end of second resistor element R2 is connected, by second switch SW2, to the negative-side connection terminal 32 among the pair of connection terminals 32. One end of capacitor C1 is connected to the gate of first switch SW1, and the other end of capacitor C1 is connected to the source of first switch SW1. Zener diode ZD1 is connected between the gate and the source of first switch SW1, and suppresses the application of excessive voltage across the gate and source of first switch SW1.

Note that Zener diode ZD1 may be replaced by a resistor having a voltage division ratio with first resistor element R1 being set such that the voltage across the gate and source of first switch SW1 is sufficient for switching the switch on. Furthermore, a resistor may be connected to Zener diode ZD1 in parallel. The same applies to Embodiment 2, described later.

In CR filter 42, when second switch SW2 is off, the time constant and the delay time are determined based on the resistance value of first resistor element R1 and the electrostatic capacitance value of capacitor C1. On the other hand, in CR filter 42, when second switch SW2 is on, the time constant and the delay time are determined based on the resistance value of second resistor element R2 and the electrostatic capacitance value of capacitor C1. Note that when second switch SW2 is on, voltage divided by first resistor element R1 and second resistor element R2 is constantly applied between the gate and the source of first switch SW1, but this divided voltage is not of a magnitude sufficient to turn first switch SW1 on. The same applies to Embodiment 2, described later. In Embodiment 1, the delay time is set such that no power is supplied to device 3 during a period in which chattering can occur when device 3 is attached to or detached from power supply line L1.

Second switch SW2 is configured to switch a point between the gate of first switch SW1 and power line L2 from one to another of a short-circuit state and an open circuit state. In Embodiment 1, second switch SW2 is a normally-off pushbutton switch, and is exposed on the outside of device 3. Second switch SW2 switches on (i.e., a short-circuit state) only while a user is pressing the switch, and remains off (i.e., an open circuit state) while the user is not pressing the switch. One end of second switch SW2 is connected to the gate of first switch SW1 via second resistor element R2, and the other end of second switch SW2 is connected to the negative-side connection terminal 32 among the pair of connection terminals 32.

Operations of suppression circuit 4 will be described hereinafter with reference to FIGS. 2A to 3B. FIGS. 2A to 3B are schematic diagrams illustrating operations of suppression circuit 4 when device 3 is attached to or detached from power supply line L1. Note that in FIGS. 2A to 3B, the way first switch SW1 is represented is different from FIG. 1 to make it easier to see whether first switch SW1 is on or off.

Figure 3A:
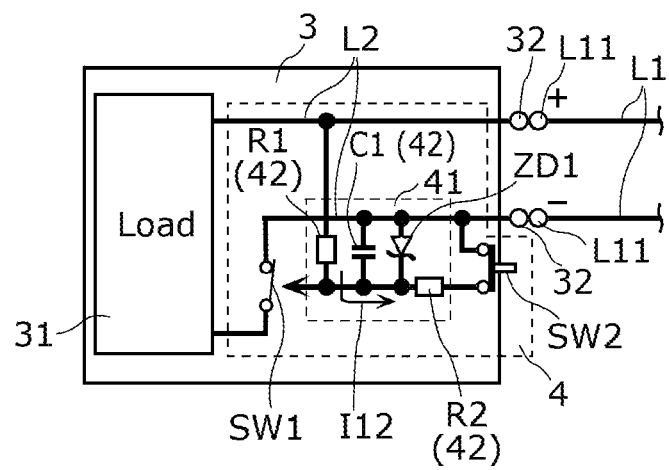
FIG. 3A is a schematic diagram illustrating operations of the suppression circuit in the arc detection system according to Embodiment 1 when a device is attached to or detached from a power supply line.
Figure 3B:
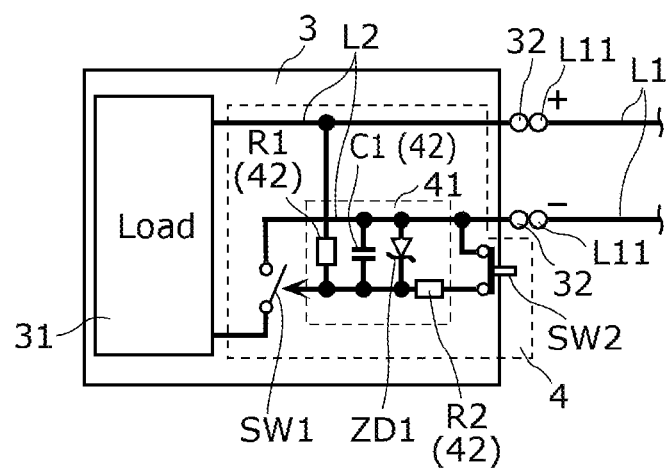
FIG. 3B is a schematic diagram illustrating operations of the suppression circuit in the arc detection system according to Embodiment 1 when a device is attached to or detached from a power supply line.

First, operations of suppression circuit 4 when device 3 is attached to power supply line L1 will be described. It is assumed here that a user attaches device 3 to power supply line L1 while operating second switch SW2. As illustrated in FIG. 3B, first switch SW1 is off and power line L2 is open at the point in time when the pair of connection terminals 32 in device 3 and the pair of connection conductors L11 in power supply line L1 make contact (also called the "time of contact" hereinafter). Additionally, at the time of contact, device 3 is electrically connected to power supply line L1, but second switch SW2 is on, and thus no charging current I11 flows in capacitor C1, and first switch SW1 does not turn on.

Here, the user inserts device 3 into power supply line L1 and rotates device 3 a predetermined angle while operating second switch SW2, which electrically and mechanically connects device 3 to power supply line L1. This completes the attachment of device 3 to power supply line L1. Then, the user takes their hand away from second switch SW2, and second switch SW2 turns off. In other words, first switch SW1 basically does not turn on as long as the user is operating second switch SW2, or in other words, until the user finishes attaching device 3 to power supply line L1.

Figure 2A:
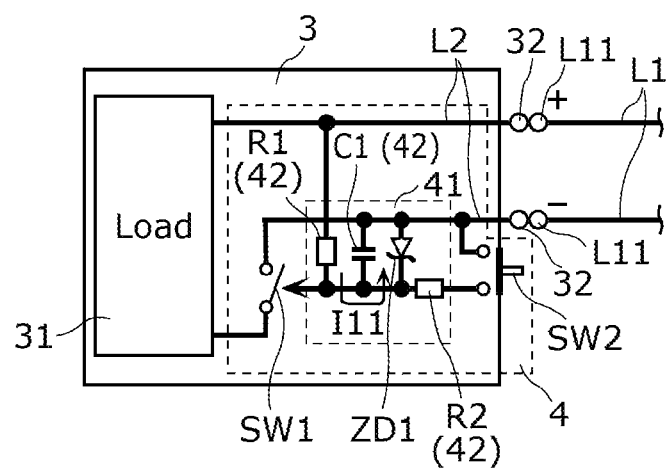
FIG. 2A is a schematic diagram illustrating operations of a suppression circuit in the arc detection system according to Embodiment 1 when a device is attached to or detached from a power supply line.
Figure 2B:
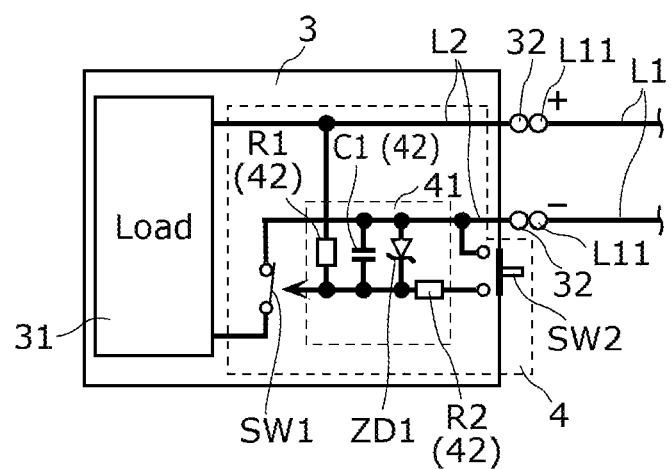
FIG. 2B is a schematic diagram illustrating operations of the suppression circuit in the arc detection system according to Embodiment 1 when a device is attached to or detached from a power supply line.

As illustrated in FIG. 2A, when second switch SW2 turns off, in CR filter 42 of drive circuit 41, charging current I11 flows to capacitor C1 via first resistor element R1, which starts charging of capacitor C1. Capacitor C1 is charged according to a time constant based on the resistance value of first resistor element R1 and the electrostatic capacitance value of capacitor C1, as described above.

Then, as Illustrated in FIG. 213, when capacitor C1 is fully charged and the charging voltage of capacitor C1 (i.e., the gate-source voltage of first switch SW1) reaches a predetermined voltage, first switch SW1 turns on and power line L2 is closed. Power is supplied to load 31 from power supply line L1 as a result.

In this manner, by turning first switch SW1 on after the delay time has passed following the point in time when device 3 is connected to power line L2 (here, the point in time when second switch SW2 is turned off), suppression circuit 4 ensures that power is supplied to load 31 from power supply line L1 after the delay time has passed following the stated point in time. Accordingly, even if chattering occurs when attaching device 3 to power supply line L1, no power is supplied to load 31 from power supply line L1 during the period when chattering occurs, and thus the occurrence of arcs caused by chattering can be suppressed.

Note that it is possible that the user will forget to press second switch SW2 when attaching device 3 to power supply line L1. In this case, charging current I11 starts flowing in capacitor C1 from the time of contact. Even in such a case, first switch SW1 is turned on after the delay time has passed following the point in time when device 3 is connected to power line L2 (here, the time of contact), and thus suppression circuit 4 ensures that power is supplied to load 31 from power supply line L1 after the delay time has passed following the stated point in time. Accordingly, even if chattering occurs in such a case, it is unlikely that power will be supplied to load 31 from power supply line L1 during the period when chattering occurs, which is expected to provide the effect of suppressing the occurrence of arcs caused by chattering.

Next, operations of suppression circuit 4 when device 3 is detached from power supply line L1 will be described. It is assumed here that the user detaches device 3 from power supply line L1 while operating second switch SW2. As illustrated in FIG. 3A, second switch SW2 is turned on before device 3 is detached from power supply line L1. Upon doing so, in CR filter 42 of drive circuit 41, discharge current I12 flows from capacitor C1 to power supply line L1 via second resistor element R2, and discharge of capacitor C1 begins. Capacitor C1 is discharged according to a time constant based on the resistance value of second resistor element R2 and the electrostatic capacitance value of capacitor C1, as described above.

Then, as illustrated in FIG. 3B, when capacitor C1 is fully discharged and the charging voltage of capacitor C1 (i.e., the gate-source voltage of first switch SW1) drops below a predetermined voltage, first switch SW1 turns off and power line L2 is opened. Power stops being supplied to load 31 from power supply line L1 as a result. Then, the pair of connection terminals 32 of device 3 are separated from the pair of connection conductors L11 of power supply line L1 by detaching device 3 from power supply line L1, and the electrical connection between device 3 and power supply line L1 is broken as a result.

In this manner, by turning first switch SW1 off after the delay time has passed following the point in time when second switch SW2 is turned on, suppression circuit 4 breaks the electrical connection between device 3 and power supply line L1 before device 3 is detached from power supply line L1. Accordingly, even if chattering occurs when detaching device 3 from power supply line L1, no power is supplied to load 31 from power supply line L1 during the period when chattering occurs, and thus the occurrence of arcs caused by chattering can be suppressed.

Note that it is possible that device 3 is detached from power supply line L1 before the delay time passes. In this case, an arc can occur at the point in time when device 3 is detached from power supply line L1, but the time for which the arc occurs can be shortened compared to a case where suppression circuit 4 is not provided, which can be said to suppress the occurrence of arcs caused by chattering.

Here, in CR filter 42, it is preferable that the resistance value of second resistor element R2 be lower than the resistance value of first resistor element R1. A lower resistance value in second resistor element R2 shortens the delay time until first switch turns off. If the delay time is short, it is less likely that device 3 will be attached to or detached from power supply line L1 before the delay time, which makes arcs caused by chattering less likely to occur. However, it is not necessarily preferable to make the delay time as short as possible, and if the delay time is made extremely short, arcs caused by first switch SW1 turning off momentarily can instead occur. It is therefore preferable to make the delay time approximately several tens of milliseconds, for example.

On the other hand, when attaching device 3 to power supply line L1, it is sufficient for load 31 to be connected to power supply line L1 after device 3 is assumed to have been securely attached to power supply line L1, and thus the delay time until first switch SW1 turns on may be long. However, if the delay time is made extremely long, the time between when device 3 is attached to power supply line L1 and when load 31 is actually driven will become longer as well, which may cause a sense of unnaturalness for the user. It is therefore preferable to make the delay time approximately several hundreds of milliseconds, for example.

[Operations]

Figure 4:
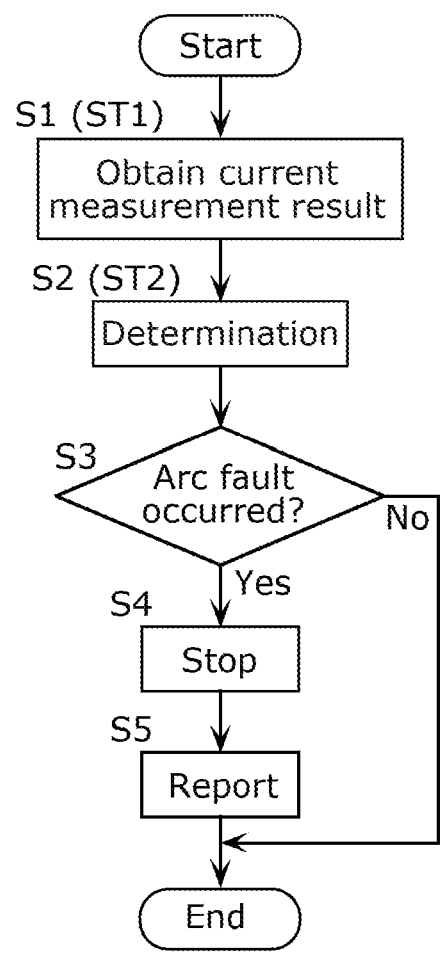
FIG. 4 is a flowchart illustrating an example of operations performed by the arc detection system according to Embodiment 1.

An example of operations performed by arc detection system 100 according to Embodiment 1 will be described next with reference to FIG. 4. FIG. 4 is a flowchart illustrating an example of operations performed by arc detection system 100 according to Embodiment 1.

First, obtainer 11 obtains the measurement result for current I1 from ammeter 22 at the predetermined cycle (S1). Process S1 corresponds to obtainment step ST1 of an arc detection method. Then, determiner 12 determines, based on a component of a specific frequency band in the measurement result for current I1 obtained by obtainer 11, whether an arc fault is occurring (S2). Here, determiner 12 makes the determination by performing a frequency analysis on the measurement result for current I1 obtained by obtainer 11.

Specifically, determiner 12 compares the aforementioned component of the specific frequency band with a threshold, and if the component of the specific frequency band is at least the threshold and a specific time for which that state continues is longer than the threshold time, determines that an arc fault is occurring (S3: Yes). On the other hand, if the specific time has not reached the threshold time, or the component of the specific frequency band is lower than the threshold, determiner 12 determines that an arc fault is not occurring (S3: No). Processes S2 and S3 correspond to determination step ST2 of the arc detection method.

When determiner 12 determines that an arc fault is occurring (S3: Yes), stopper 14 stops the supply of power from DC power source 2 to power supply line L1 by stopping the current flowing in power supply line L1 (S4), Reporter 13 then makes a report of the occurrence of the arc fault (S5). On the other hand, when determiner 12 determines that an arc fault is not occurring (S3: No), the processing by arc detection system 100 ends. The above series of processes S1 to S5 is then repeated.

[Advantages]

Advantages of arc detection system 100 according to Embodiment 1 will be described here through a comparison with an arc detection system of a comparative example. The arc detection system of the comparative example differs from arc detection system 100 according to Embodiment 1 in that when the component of the specific frequency band in the measurement result for current I1 obtained by obtainer 11 exceeds the threshold, it is immediately determined that an arc fault has occurred.

First, conditions required for the arc detection system will be described. When an arc occurs due to a disconnect or a semi-disconnect of power supply line L1, and that state is left as is, the area of the disconnect or the semi-disconnect may overheat and, some cases, ignite and lead to a fire. Accordingly, it is important for an arc detection system to quickly detect the occurrence of an arc (i.e., the occurrence of an arc fault) and stop the supply of power to power supply line L1 before a situation such as a fire occurs. For example, the Underwriters Laboratories (UL) standard requires that the occurrence of an arc fault be detected within two seconds of the occurrence of an arc.

The arc detection system of the comparative example can also detect the occurrence of arc faults. However, the arc detection system of the comparative example determines that an arc fault has occurred not only when an arc caused by a disconnect or a semi-disconnect in power supply line L1 occurs, but also when an arc caused by chattering occurs. In other words, the arc detection system of the comparative example erroneously determines that an arc fault has occurred even when an arc which is unlikely to cause an arc failure occurs. In this manner, the arc detection system of the comparative example determines that an arc fault has occurred each time an arc occurs, which can reduce the user-friendliness. For example, a situation can arise where the user is notified that an arc fault has occurred each time device 3 is attached to or detached from power supply line L1, which is annoying for the user. Meanwhile, assume that the supply of power from DC power source 2 to power supply line L1 is configured to stop automatically when an arc fault is determined to have occurred, for example. With such a configuration, a situation can arise where the supply of power to power supply line L1 is stopped each time device 3 is attached to or detached from power supply line L1, which also is annoying for the user.

On the other hand, arc detection system 100 according to Embodiment 1 determines that an arc fault has occurred when an arc caused by a disconnect or a semi-disconnect in power supply line L1 occurs, but basically does not determine that an arc fault has occurred when an arc caused by chattering occurs. In other words, arc detection system 100 according to Embodiment 1 is unlikely to determine that an arc fault has occurred due to the occurrence of an arc which is unlikely to cause an arc fault. In other words, arc detection system 100 according to Embodiment 1 has an advantage in that there is no need to detect events which do not lead to arc faults when occurring only temporarily, such as arcs which can occur when device 3 is attached to or detached from power supply line L1, which makes it easier to prevent erroneous detections of the occurrence of arc faults. Accordingly, the above-described situations which can occur in the arc detection system of the comparative example are unlikely to occur in arc detection system 100 according to Embodiment 1. In other words, arc detection system 100 according to Embodiment 1 has an advantage in that a report can be made to a user, the supply of power to power supply line L1 can be stopped, and so on only when an arc fault considered to have a particularly large impact on the user occurs, and is therefore user-friendly.

Embodiment 2

[Configuration]

Figure 5:
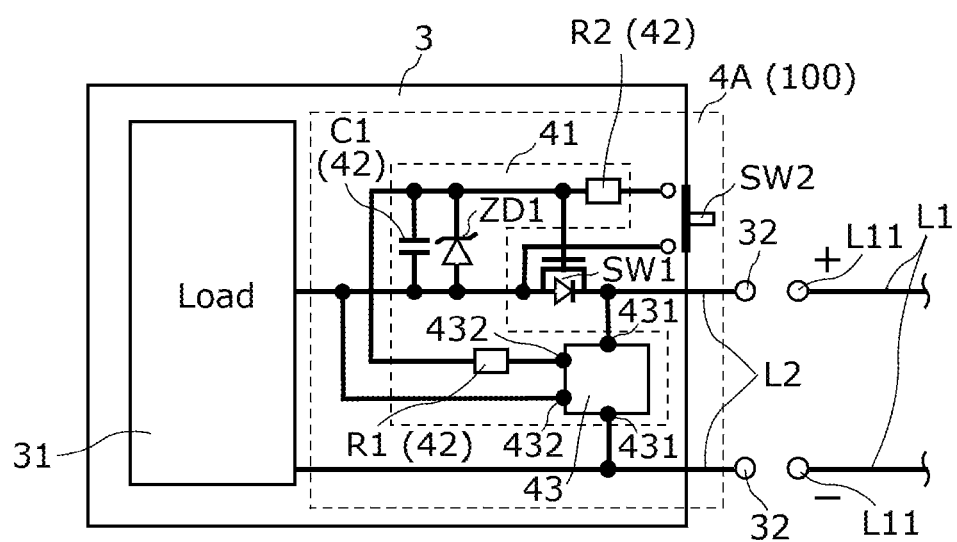
FIG. 5 is a schematic diagram illustrating the overall configuration of an arc detection system according to Embodiment 2.

Arc detection system 100 according to Embodiment 2 will be described hereinafter with reference to FIG. 5, FIG. 5 is a schematic diagram illustrating the overall configuration of arc detection system 100 according to Embodiment 2. DC power source 2 is not illustrated in FIG. 5, Accordingly, obtainer 11, determiner 12, reporter 13, and stopper 14, which are constituent elements of arc detection system 100, are not illustrated in FIG. 5, In arc detection system 100 according to Embodiment 2, the configuration of suppression circuit 4A differs from the configuration of suppression circuit 4 of arc detection system 100 according to Embodiment 1. The following will mainly describe differences from Embodiment 1, and descriptions of points common with Embodiment 1 will be omitted as appropriate.

In Embodiment 2, suppression circuit 4A includes first switch SW1, second switch SW2, and drive circuit 41, similar to suppression circuit 4 of Embodiment 1. However, suppression circuit 4A of Embodiment 2 differs from suppression circuit 4 of Embodiment 1 in terms of the arrangement of the constituent elements of first switch SW1, second switch SW2, and drive circuit 41. Additionally, unlike suppression circuit 4 of Embodiment 1, drive circuit 41 of Embodiment 2 further includes power source circuit 43.

Similar to Embodiment 1, first switch SW1 is an n-channel enhancement-type MOSFET. The drain of first switch SW1 is connected to the positive-side connection terminal 32 among the pair of connection terminals 32, and the source of first switch SW1 is connected to the positive electrode of load 31. Drive circuit 41 is connected to the gate of first switch SW1.

Similar to Embodiment 1, second switch SW2 is a normally-off pushbutton switch. One end of second switch SW2 is connected to the gate of first switch SW1 via second resistor element R2, and the other end of second switch SW2 is connected to the positive-side connection terminal 32 among the pair of connection terminals 32.

Drive circuit 41 includes first resistor element R1, second resistor element R2, capacitor C1, Zener diode ZD1, and power source circuit 43. CR filter 42 is constituted by first resistor element R1, second resistor element R2, and capacitor C1. One end of first resistor element R1 is connected to the gate of first switch SW1, and the other end of first resistor element R1 is connected to a high voltage-side output terminal 432 among a pair of output terminals 432 of power source circuit 43. One end of second resistor element R2 is connected to the gate of first switch SW1, and the other end of second resistor element R2 is connected, by second switch SW2, to the positive-side connection terminal 32 among the pair of connection terminals 32. One end of capacitor C1 is connected to the gate of first switch SW1, and the other end of capacitor C1 is connected to the source of first switch SW1. Zener diode ZD1 is connected between the gate and the source of first switch SW1, and suppresses the application of excessive voltage across the gate and source of first switch SW1.

Power source circuit 43 includes a pair of input terminals 431 and the pair of output terminals 432, and the pair of input terminals 431 and the pair of output terminals 432 are electrically isolated from each other. Power source circuit 43 generates a drive voltage for driving the gate of first switch SW1 based on a voltage applied to the pair of input terminals 431, and outputs the generated drive voltage from the pair of output terminals 432. The pair of input terminals 431 are connected to the pair of connection terminals 32, respectively. The high voltage-side output terminal 432 among the pair of output terminals 432 is connected to the gate of first switch SW1 via first resistor element R1, and a low voltage-side output terminal 432 is connected to the positive electrode of load 31.

In CR filter 42, when second switch SW2 is off, the time constant and the delay time are determined based on the resistance value of first resistor element R1 and the electrostatic capacitance value of capacitor C1. On the other hand, in CR filter 42, when second switch SW2 is on, the time constant and the delay time are determined based on the resistance value of second resistor element R2 and the electrostatic capacitance value of capacitor C1.

Operations of suppression circuit 4A will be described hereinafter. First, operations of suppression circuit 4A when device 3 is attached to power supply line L1 will be described. It is assumed here that a user attaches device 3 to power supply line L1 while operating second switch SW2, First switch SW1 is off and power line L2 is open at the point in time when the pair of connection terminals 32 in device 3 and the pair of connection conductors L11 in power supply line L1 make contact (also called the "time of contact" hereinafter). Additionally, at the time of contact, device 3 is electrically connected to power supply line L1, but second switch SW2 is on, and thus no charging current flows in capacitor C1, and first switch SW1 does not turn on.

Here, the user inserts device 3 into power supply line L1 and rotates device 3 a predetermined angle while operating second switch SW2, which electrically and mechanically connects device 3 to power supply line L1. This completes the attachment of device 3 to power supply line L1. Then, the user takes their hand away from second switch SW2, and second switch SW2 turns off. In other words, first switch SW1 basically does not turn on as long as the user is operating second switch SW2, or in other words, until the user finishes attaching device 3 to power supply line L1.

When second switch SW2 turns off, voltage from power supply line L1 is applied to the pair of input terminals 431 of power source circuit 43. As a result, power source circuit 43 generates the drive voltage, and the generated drive voltage is output from the pair of output terminals 432, Through this, in CR filter 42 of drive circuit 41, charging current flows to capacitor C1 via first resistor element R1, and charging of capacitor C1 starts. Capacitor C1 is charged according to a time constant based on the resistance value of first resistor element R1 and the electrostatic capacitance value of capacitor C1, as described above.

Then, when capacitor C1 is fully charged and the charging voltage of capacitor C1 (i.e., the gate-source voltage of first switch SW1) reaches a predetermined voltage, first switch SW1 turns on and power line L2 is closed. Power is supplied to load 31 from power supply line L1 as a result.

Next, operations of suppression circuit 4A when device 3 is detached from power supply line L1 will be described. It is assumed here that the user detaches device 3 from power supply line L1 while operating second switch SW2. Second switch SW2 is turned on before device 3 is detached from power supply line L1. Upon doing so, in CR filter 42 of drive circuit 41, discharge current flows from capacitor C1 to power supply line L1 via second resistor element R2, and discharge of capacitor C1 begins. Capacitor C1 is discharged according to a time constant based on the resistance value of second resistor element R2 and the electrostatic capacitance value of capacitor C1, as described above.

Then, when capacitor C1 is fully discharged and the charging voltage of capacitor C1 (i.e., the gate-source voltage of first switch SW1) drops below a predetermined voltage, first switch SW1 turns off and power line L2 is opened. Power stops being supplied to load 31 from power supply line L1 as a result. Then, the pair of connection terminals 32 of device 3 are separated from the pair of connection conductors L11 of power supply line L1 by detaching device 3 from power supply line L1, and the electrical connection between device 3 and power supply line L1 is broken as a result.

As described above, in arc detection system 100 according to Embodiment 2 as well, suppression circuit 4A operates in a manner similar to suppression circuit 4 of Embodiment 1. Aside from suppression circuit 4A, arc detection system 100 according to Embodiment 2 has the same configuration as arc detection system 100 according to Embodiment 1. As such, arc detection system 100 according to Embodiment 2 can achieve the same effects as arc detection system 100 according to Embodiment 1.

Other Embodiments

Although Embodiments 1 and 2 have been described thus far, the present invention is not limited to the foregoing Embodiments 1 and 2. Variations on Embodiments 1 and 2 will be described hereinafter. The variations described hereinafter may be combined with each other as appropriate.

In Embodiments 1 and 2, ammeter 22 is a device separate from arc detection system 100, but ammeter 22 may be built into arc detection system 100.

In Embodiments 1 and 2, arc detection system 100 is provided in DC power source 2, but the configuration is not limited thereto. For example, arc detection system 100 may be connected to power supply line L1 as a device separate from DC power source 2, In this case, if arc detection system 100 is configured to be capable of communicating with DC power source 2 through wired communication or wireless communication, DC power source 2 can be given instructions according to the results of the determination by determiner 12.

In Embodiments 1 and 2, determiner 12 extracts the component of the specific frequency band by performing frequency analysis on the measurement result for current I1 obtained by obtainer 11, but the configuration is not limited thereto. For example, rather than performing frequency analysis, determiner 12 may extract a frequency component of the specific frequency band by passing the measurement result for current I1 obtained by obtainer 11 through a filter (e.g., a band pass filter).

In Embodiments 1 and 2, second switch SW2 is configured to switch on and off by being operated by the user manually, but the configuration is not limited thereto. For example, second switch SW2 may be configured to switch on and off automatically in response to device 3 being attached to or detached from power supply line L1. For example, second switch SW2 may be configured to temporarily switch to a short-circuit state at least when device 3 is detached from power supply line L1.

A specific example of the above-described configuration will be described hereinafter. In the specific example, second switch SW2 is configured as a normally-on pushbutton switch, which switches off (an open circuit state) in response to a predetermined force being applied thereto. In other words, second switch SW2 stays on (in a short-circuit state) while device 3 is not attached to power supply line L1, and switches off in response to a predetermined force being applied when device 3 is attached to power supply line L1.

Operations of second switch SW2 in the above-described specific example will be described hereinafter. When attaching device 3 to power supply line L1, first, device 3 is inserted into power supply line L1. At this point in time, second switch SW2 is still on. After this, device 3 is connected to power supply line L1 by rotating device 3 a predetermined angle. At this time, a predetermined force is applied to second switch SW2 from device 3 and power supply line L1 as device 3 is being rotated. This causes second switch SW2 to switch off. Second switch SW2 remains off as long as device 3 is attached to power supply line L1.

When detaching device 3 from power supply line L1, device 3 is rotated a predetermined angle in the opposite direction from when being attached. At the start of the rotation of device 3, second switch SW2 is released from the force applied to device 3 and power supply line L1, and switches on. Then, load 31 is disconnected from power supply line L1 partway through the rotation of device 3.

With this configuration, second switch SW2 switches on and off automatically in response to device 3 being attached to or detached from power supply line L1, without being directly operated by the user. Then, second switch SW2 switches on before device 3 is detached from power supply line L1 (in other words, temporarily switches to the short-circuit state at least when device 3 is detached from power supply line L1). Similar to the case where the user operates second switch SW2 when detaching device 3 from power supply line L1, in this configuration, device 3 and power supply line L1 are electrically disconnected before device 3 is detached from power supply line L1. Accordingly, with this configuration, even if chattering occurs when detaching device 3 from power supply line L1, no power is supplied to load 31 from power supply line L1 during the period when chattering occurs, and thus the occurrence of arcs caused by chattering can be suppressed.

In Embodiments 1 and 2, suppression circuits 4 and 4A need not include second switch SW2. Additionally, in Embodiments 1 and 2, arc detection system 100 need not include reporter 13 and stopper 14. In other words, it is sufficient for arc detection system 100 to have a function for detecting the occurrence of arc faults, and thus reporter 13 and stopper 14 may be implemented by a separate system.

In Embodiments 1 and 2, suppression circuits 4 and 4A are provided in each device 3, but the configuration is not limited thereto. For example, suppression circuits 4 and 4A may be provided in only some devices 3 among the plurality of devices 3. Additionally, for example, suppression circuits 4 and 4A need not be provided in any of devices 3. In other words, arc detection system 100 need not include suppression circuits 4 and 4A. Additionally, for example, suppression circuits 4 and 4A may be provided in connectors for connecting device 3 to power supply line L1, separate from devices 3.

For example, the present invention can be realized not only as arc detection system 100 and the like, but also as an arc detection method including steps (processes) performed by the constituent elements constituting arc detection system 100.

Specifically, the arc detection method includes obtainment step ST1 and determination step ST2. In obtainment step ST1, a measurement result is obtained for current I1 flowing in power supply line L1 to which power is supplied from DC power source 2. In determination step ST2, it is determined, based on a component of a specific frequency band in the measurement result for current obtained in obtainment step ST1, whether an arc fault has occurred. In determination step ST2, the arc fault is determined to have occurred when the specific time for which the component of the specific frequency band is at least the threshold is longer than the occurrence time in which an arc can occur when device 3 is attached to or detached from power supply line L1.

For example, these steps may be executed by a computer (a computer system) having at least one processor. The present invention can then be implemented as a program for causing a computer to perform the steps included in the method. Furthermore, the present invention can be implemented as a non-transitory computer-readable recording medium, such as a CD-ROM, in which the program is recorded. Specifically, the program causes at least one processor to execute the above-described arc detection method.

At least part of arc detection system 100 according to the foregoing embodiments is implemented through software by a microcomputer, but may also be implemented through software in a general-purpose computer such as a personal computer.

Furthermore, at least part of arc detection system 100 may be realized through hardware by dedicated electronic circuits constituted by A/D converters, logic circuits, gate arrays, D/A converters, and the like.

Additionally, suppression circuits 4 and 4A in Embodiments 1 and 2 may be brought to market independent from arc detection system 100. In other words, suppression circuits 4 and 4A include first switch SW1 and drive circuit 41, First switch SW1 opens and closes power line L2 between power supply line L1, to which power from DC power source 2 is supplied, and load 31 in device 3, which can be attached to and detached from power supply line L1. Drive circuit 41 drives first switch SW1 to close power line L2 after the delay time following device 3 being connected to power line L2.

Suppression circuits 4 and 4A may also be configured as described hereinafter, for example, That is, first switch SW1 is a field effect transistor. Drive circuit 41 further includes CR filter 42, which is connected to the gate of first switch SW1 and which applies a charging voltage for capacitor C1 to the gate of first switch SW1. The delay time is determined by a time constant of CR filter 42.

Suppression circuits 4 and 4A may further be configured as described hereinafter, for example. That is, suppression circuits 4 and 4A further include second switch SW2, which switches a point between the gate of first switch SW1 and power line L2 from one to another of a short-circuit state and an open circuit state.

Suppression circuits 4 and 4A may further be configured as described hereinafter, for example, That is, second switch SW2 is configured to temporarily switch to a short-circuit state at least when device 3 is detached from power supply line L1.

Suppression circuits 4 and 4A may also be configured as described hereinafter, for example. That is, the delay time is set such that no power is supplied to device 3 during a period in which chattering can occur when device 3 is attached to or detached from power supply line L1.

Suppression circuits 4 and 4A described above have an advantage in that arcs caused by chattering that can occur when device 3 is attached to or detached from power supply line L1 are unlikely to occur.

Note that first switch SW1 is not limited to a field effect transistor, and may be a relay or the like, for example.

Additionally, embodiments achieved by one skilled in the art making various conceivable variations on the embodiments, embodiments achieved by combining constituent elements and functions from the embodiments as desired within a scope which does not depart from the spirit of the present invention, and the like are also included in the present invention.

CONCLUSION

As described above, arc detection system 100 includes obtainer 11 and determiner 12. Obtainer 11 obtains a measurement result for current I1 flowing in power supply line L1 to which power is supplied from DC power source 2. Determiner 12 determines, based on a component of a specific frequency band in the measurement result for current I1 obtained by obtainer 11, whether an arc fault has occurred. Determiner 12 determines that the arc fault has occurred when the specific time for which the component of the specific frequency band is at least the threshold is longer than the occurrence time in which an arc can occur when device 3 is attached to or detached from power supply line L1.

This arc detection system 100 has an advantage in that there is no need to detect events which do not lead to arc faults when occurring only temporarily, such as arcs which can occur when device 3 is attached to or detached from power supply line L1, which makes it easier to prevent erroneous detections of the occurrence of arc faults.

Additionally, for example, arc detection system 100 further includes suppression circuits 4 and 4A that suppress the arc that can occur when device 3 is attached to or detached from power supply line L1. Suppression circuits 4 and 4A include first switch SW1 and drive circuit 41. First switch SW1 opens and closes power line L2 between load 31 of device 3 and power supply line L1. Drive circuit 41 drives first switch SW1 to close power line L2 after the delay time following device 3 being connected to power line L2.

According to this arc detection system 100, load 31 of device 3 is connected to power supply line L1 after device 3 is assumed to have been attached to power supply line L1, which makes it unlikely that a situation where load 31 is momentarily disconnected from power supply line L1 in a state where current is flowing will arise. This provides an advantage in that arcs caused by chattering that can occur when device 3 is attached to or detached from power supply line L1 are unlikely to occur.

Additionally, for example, in arc detection system 100, first switch SW1 is a field effect transistor. Drive circuit 41 further includes CR filter 42, which is connected to the gate of first switch SW1 and which applies a charging voltage for capacitor C1 to the gate of first switch SW1. The delay time is determined by a time constant of CR filter 42.

According to this arc detection system 100, load 31 of device 3 is connected to power supply line L1 after device 3 is assumed to have been attached to power supply line L1, which makes it unlikely that a situation where load 31 is momentarily disconnected from power supply line L1 in a state where current is flowing will arise. This provides an advantage in that arcs caused by chattering that can occur when device 3 is attached to or detached from power supply line L1 are unlikely to occur.

Additionally, for example, in arc detection system 100, suppression circuits 4 and 4A further include second switch SW2, which switches a point between the gate of first switch SW1 and power line L2 from one to another of a short-circuit state and an open circuit state.

According to this arc detection system 100, by operating second switch SW2 when detaching device 3 from power supply line L1, device 3 and power supply line L1 can be electrically disconnected before device 3 is detached from power supply line L1. This provides an advantage in that no power is supplied to load 31 from power supply line L1 during the period when chattering can occur, and thus the occurrence of arcs caused by chattering can be suppressed.

Additionally, for example, in arc detection system 100, second switch SW2 is configured to temporarily switch to a short-circuit state at least when device 3 is detached from power supply line L1.

This arc detection system 100 has an advantage in that when detaching device 3 from power supply line L1, device 3 and power supply line L1 can be electrically disconnected automatically before device 3 is detached from power supply line L1.

Additionally, for example, in arc detection system 100, the delay time is set such that no power is supplied to device 3 during a period in which chattering can occur when device 3 is attached to or detached from power supply line L1. The specific time is longer than the delay time.

This arc detection system 100 has an advantage in that it is easy to prevent the occurrence of an arc caused by chattering from being erroneously determined as the occurrence of an arc fault.

Additionally, for example, the arc detection method includes obtainment step ST1 and determination step ST2. In obtainment step ST1, a measurement result is obtained for current I1 flowing in power supply line L1 to which power is supplied from DC power source 2. In determination step ST2, it is determined, based on a component of a specific frequency band in the measurement result for current I1 obtained in obtainment step ST1, whether an arc fault has occurred. In determination step ST2, the arc fault is determined to have occurred when the specific time for which the component of the specific frequency band is at least the threshold is longer than the occurrence time in which an arc can occur when device 3 is attached to or detached from power supply line L1.

This arc detection method has an advantage in that there is no need to detect events which do not lead to arc faults when occurring only temporarily, such as arcs which can occur when device 3 is attached to or detached from power supply line L1, which makes it easier to prevent erroneous detections of the occurrence of arc faults.

Additionally, for example, a recording medium is a non-transitory computer-readable recording medium having recorded thereon a program that causes at least one processor to execute the above-described arc detection method.

This recording medium has an advantage in that there is no need to detect events which do not lead to arc faults when occurring only temporarily, such as arcs which can occur when device 3 is attached to or detached from power supply line L1, which makes it easier to prevent erroneous detections of the occurrence of arc faults.

The invention claimed is:

1. An arc detection system comprising:
an obtainer that obtains a measurement result for current flowing in a power supply line to which power is supplied from a DC power source; and
a determiner that, based on a component of a specific frequency band in the measurement result for the current obtained by the obtainer, determines whether an arc fault has occurred,
wherein the determiner determines that the arc fault has occurred when a specific time for which the component of the specific frequency band is at least a threshold is longer than an occurrence time in which an arc can occur when a device is attached to or detached from the power supply line.

2. The arc detection system according to claim 1, further comprising:
a suppression circuit that suppresses the arc that can occur when the device is attached to or detached from the power supply line,
wherein the suppression circuit includes:
a first switch that opens and closes a power line between a load of the device and the power supply line; and
a drive circuit that drives the first switch to close the power line after a delay time following the device being connected to the power line.

3. The arc detection system according to claim 2,
wherein the first switch is a field effect transistor,
the drive circuit further includes a CR filter that is connected to a gate of the first switch and that applies a capacitor charging voltage to the gate of the first switch, and
the delay time is determined by a time constant of the CR filter.

4. The arc detection system according to claim 3,
wherein the suppression circuit further includes a second switch that switches a connection between the gate of the first switch and the power line from one to another of a short-circuit state and an open circuit state.

5. The arc detection system according to claim 4,
wherein the second switch is configured to temporarily switch to the short-circuit state at least when the device is detached from the power supply line.

6. The arc detection system according to claim 2,
wherein the delay time is set such that no power is supplied to the device during a period in which chattering can occur when the device is attached to or detached from the power supply line, and
the specific time is longer than the delay time.

7. An arc detection method comprising:
obtaining a measurement result for current flowing in a power supply line to which power is supplied from a DC power source; and
determining, based on a component of a specific frequency band in the measurement result for the current obtained in the obtaining, whether an arc fault has occurred,
wherein the determining includes determining that the arc fault has occurred when a specific time for which the component of the specific frequency band is at least a threshold is longer than an occurrence time in which an arc can occur when a device is attached to or detached from the power supply line.

8. A non-transitory computer-readable recording medium having recorded thereon a program that causes at least one processor to execute the arc detection method according to claim 7.

* * * * *